United States Patent
Van Buuren et al.

(10) Patent No.: US 12,211,715 B2
(45) Date of Patent: Jan. 28, 2025

(54) SUBSTRATE VACUUM TREATMENT APPARATUS AND METHOD THEREFOR

(71) Applicant: EVATEC AG, Trübbach (CH)

(72) Inventors: Gaston Van Buuren, Wangs (CH); Daniele Zorzi, Eschenbach (CH); Christian Egli, Sevelen (CH)

(73) Assignee: EVATEC AG, Trübbach (CH)

( * ) Notice: Subject to any disclaimer, the term of this patent is extended or adjusted under 35 U.S.C. 154(b) by 1109 days.

(21) Appl. No.: 17/044,467

(22) PCT Filed: Apr. 30, 2019

(86) PCT No.: PCT/EP2019/061026
§ 371 (c)(1),
(2) Date: Oct. 1, 2020

(87) PCT Pub. No.: WO2019/219371
PCT Pub. Date: Nov. 21, 2019

(65) Prior Publication Data
US 2021/0143036 A1 May 13, 2021

(30) Foreign Application Priority Data
May 15, 2018 (CH) .................... 00604/18

(51) Int. Cl.
*H01L 21/67* (2006.01)
*B65G 47/90* (2006.01)
(52) U.S. Cl.
CPC ........ *H01L 21/67201* (2013.01); *B65G 47/90* (2013.01); *H01L 21/67167* (2013.01)

(58) Field of Classification Search
CPC .................................................... H01L 21/67
See application file for complete search history.

(56) References Cited

U.S. PATENT DOCUMENTS

| | | | | |
|---|---|---|---|---|
| 6,086,678 | A * | 7/2000 | Wilson | H01L 21/67748 118/715 |
| 6,174,377 | B1 * | 1/2001 | Doering | C23C 16/4583 219/465.1 |
| 2003/0063965 | A1 * | 4/2003 | Langan | H01L 21/67736 414/217 |
| 2003/0113188 | A1 * | 6/2003 | Pool | H01L 21/67201 414/217 |

(Continued)

FOREIGN PATENT DOCUMENTS

| | | |
|---|---|---|
| DE | 2114470 A1 | 9/1972 |
| EP | 0684630 A2 | 11/1995 |

(Continued)

OTHER PUBLICATIONS

International Search Report for PCT/EP2019/061026 dated Jul. 11, 2019.
Written Opinion for PCT/EP2019/061026 dated Jul. 11, 2019.

*Primary Examiner* — Ronald P Jarrett
(74) *Attorney, Agent, or Firm* — McDonald Hopkins LLC

(57) ABSTRACT

A vacuum treatment apparatus for substrate including a vacuum treatment arrangement. An input load-lock arrangement leads towards and into the vacuum treatment arrangement and an output load-lock arrangement leads from the vacuum treatment arrangement. One of the two load-lock arrangements includes at least two load-locks in series respectively pumped by pumps.

30 Claims, 11 Drawing Sheets

(56) References Cited

U.S. PATENT DOCUMENTS

Figure 1:
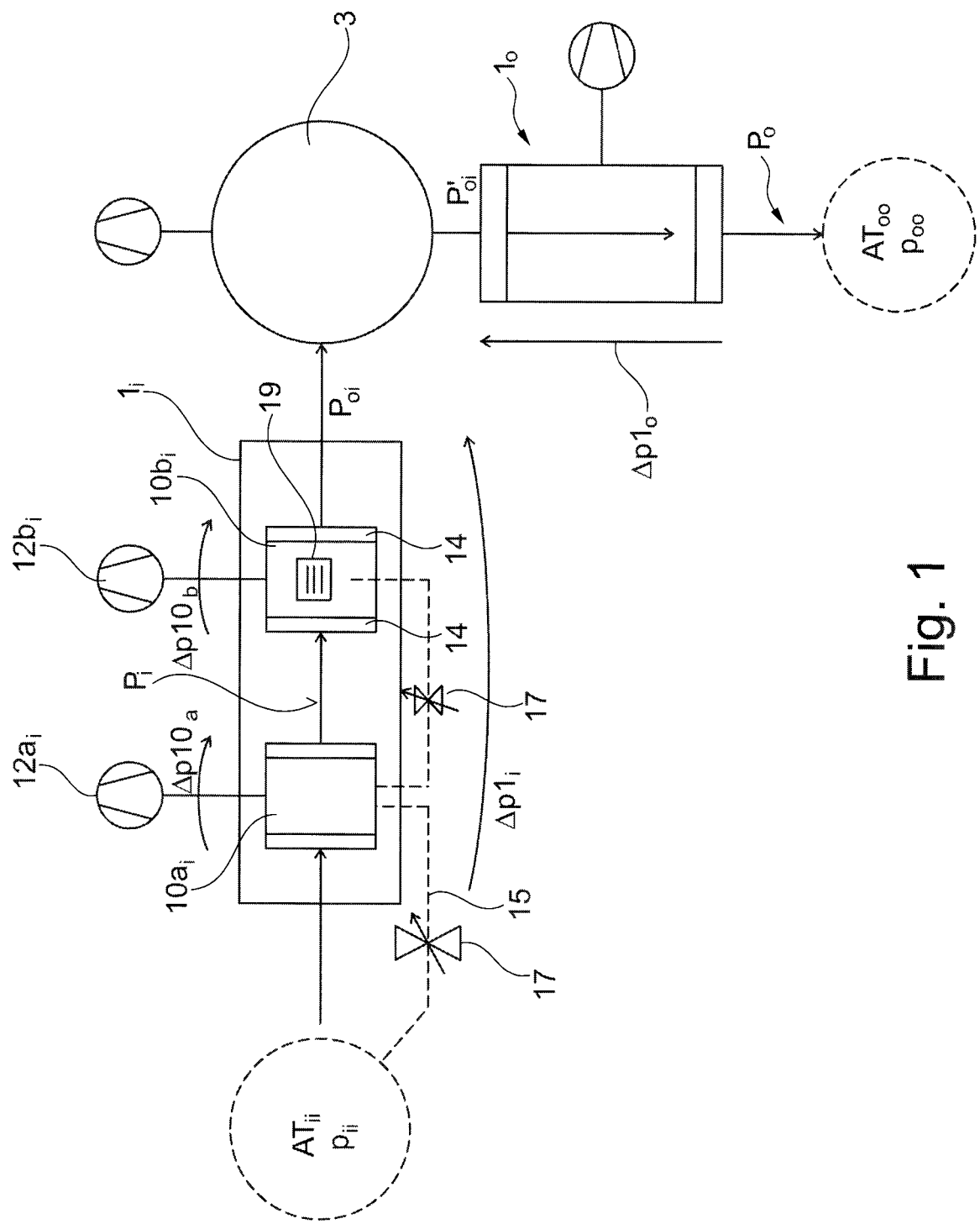

| | | |
|---|---|---|
| 2004/0238122 A1 | 12/2004 | Ishizawa et al. |
| 2005/0006230 A1 | 1/2005 | Narushima et al. |
| 2005/0034767 A1 | 2/2005 | Reimer et al. |
| 2006/0182532 A1 | 8/2006 | Okada et al. |
| 2007/0207014 A1 | 9/2007 | Toshima |
| 2008/0053957 A1 | 3/2008 | Wakabayashi |
| 2009/0266410 A1 | 10/2009 | Yoshioka |
| 2010/0304027 A1 | 12/2010 | Lee et al. |
| 2013/0312835 A1 | 11/2013 | Minshall et al. |
| 2014/0003891 A1 | 1/2014 | Kobayashi |
| 2015/0364299 A1 | 12/2015 | Fujii et al. |

FOREIGN PATENT DOCUMENTS

| | | |
|---|---|---|
| JP | H08293534 A | 11/1996 |
| JP | 2003006008 A | 1/2003 |
| JP | 2003077976 A | 3/2003 |
| JP | 2003197709 A | 7/2003 |
| JP | 2008053302 A | 3/2008 |
| TW | 201725646 A | 7/2017 |
| WO | 9959928 A2 | 11/1999 |

\* cited by examiner

SUBSTRATE VACUUM TREATMENT APPARATUS AND METHOD THEREFOR

In the art of vacuum treating substrates it is common to convey untreated substrates e.g. from ambient atmosphere via an input load-lock arrangement towards a vacuum treatment arrangement, comprising a vacuum transport chamber serving multiple treatment chambers. In the treatment chambers the substrates are subjected to one or more than one vacuum treatment e.g. to etching, to layer deposition, etc. The substrates once treated are removed through the vacuum transport chamber and via an output load-lock arrangement to ambient atmosphere. The substrates are conveyed through the respective input-and output load-lock arrangements by means of respective input and output conveyer arrangements.

Thereby the respective load-lock arrangements may be monodirectional, i.e. the input load-lock is served by an input conveyer arrangement conveying substrates exclusively towards the vacuum treatment arrangement and the output load-lock arrangement is served by an output conveyer arrangement conveying substrates exclusively from the vacuum treatment arrangement. Alternatively, a bidirectional load-lock arrangement may be provided which is served by a conveyer arrangement conveying substrates towards as well as from the vacuum treatment arrangement. Customarily the respective input- and output load lock arrangements are realized by respective single load locks.

Definitions:

We understand in the present description and claims under the term "load-lock" a chamber which, in operation, is operatively connected to a pump and has at least one input valve for a substrate and at least one output valve for a substrate. One of the load-lock valves controllably separates the inner atmosphere of the chamber from an atmosphere at one pressure, the other of the load-lock valves separates the inner atmosphere of the chamber from an atmosphere at a different, further pressure.

It is an object of the present invention to provide an alternative vacuum treatment apparatus and method of vacuum treating a substrate or of manufacturing a vacuum treated substrate.

According to the invention this object is resolved by a substrate vacuum treatment apparatus comprising a vacuum treatment arrangement for at least one substrate. The vacuum treatment arrangement comprises a vacuum transport chamber serving multiple treatment chambers. There is provided an input load-lock arrangement, cooperating with an input conveyer arrangement, and conveying substrates to the vacuum transport chamber. This input load-lock arrangement thus bridges an atmosphere of a higher pressure e.g. ambient atmosphere to an atmosphere of lower pressure, a vacuum pressure, in the vacuum transport chamber, seen in direction of input conveyance.

There is further provided an output load-lock arrangement, cooperating with an output conveyer arrangement, from the vacuum transport chamber. This output load-lock arrangement thus bridges an atmosphere of a lower pressure, i.e. vacuum pressure in the vacuum transport chamber, and an atmosphere of higher pressure, e.g. ambient atmosphere, seen in direction of output conveyance.

Thereby, at least one of the inputs and of the output load-lock arrangements comprises at least two load-locks in series, considered along the conveyance pass of the respective conveyor arrangement. It is this at least one load-lock arrangement which is interconnected between the vacuum transport chamber and ambient atmosphere.

Thus "load-locking" the substrates toward and/or from the vacuum transport chamber is performed by subsequently bridging smaller pressure differences, compared with the difference to be bridged by a respective single load-lock "over-all" load-lock arrangement.

This leads to the advantage, that the respective load-locks may be pumped by means of pumps specifically selected for operating in pressure ranges as to be bridged by the load-locks considered. E.g. considered along an input load-lock arrangement communicating with ambient atmosphere, a first load-lock may be pumped by a rough pump, whereas a subsequent load-lock may be pumped by a high vacuum pump, like a turbo-molecular pump.

The throughput of the apparatus may be improved due to the fact that the pressure differences to be bridged by the at least two load-locks are reduced, compared to the pressure difference to be bridged by a respective load-lock arrangement realized by a single load-lock. This leads to shortened pumping times and shortened pressure equalization times. Moreover, the volumes of the at least two load-locks at the respective arrangements may be minimized, which additionally shortens pumping times and pressure equalization times.

A further advantage which is reached by subdividing at least one of the input and output load-lock arrangements in at least two load-locks is that the substrate is exposed for a longer time span to lower pressures, especially to vacuum pressures, than in a single load-lock load-lock arrangement. This improves substrate conditioning when substrates are served towards the vacuum transport chamber or when substrates are served from the vacuum transport chamber of a vacuum treatment arrangement.

In one embodiment of the apparatus according to the invention the input and the output load-lock arrangements comprise each at least two load-locks in series along the conveyance pass of the respective conveyor arrangement.

In one embodiment of the apparatus according to the invention at least the input load-lock arrangement comprises the at least two load-locks in series and at least one of the at least two load-locks of the input load lock-arrangement is not a load lock of the output load-lock arrangement.

In one embodiment of the apparatus according to the invention at least the output load-lock arrangement comprises the at least two load-locks in series and at least one of the at least two load-locks of the output load lock-arrangement is not a load lock of the input load-lock arrangement.

Thus, even all the at least two load-locks of the input load-lock arrangement may be part only of the input load-lock, irrespective whether the output load-lock arrangement has as well at least two load-locks as addressed or not. In analogy, even all the at least two load-locks of the output load-lock arrangement may be part only of the output load-lock arrangement, irrespective whether the input load-lock arrangement has at least two of the addressed load-locks or not.

Clearly load-locks commonly applied to the input and to the output load-lock arrangements are bi-directionally served, whereas load-locks specifically of one of the input and of the output load-lock arrangements are mono-directionally served.

In one embodiment of the apparatus according to the invention at least one of the at least two load-locks is common to the input and to the output load-lock arrangement.

In one embodiment of the embodiment just addressed of apparatus according to the invention the common load-lock is nearer to the vacuum transport chamber than the other load-lock of the at least two load locks not common to the input and to the output load-lock arrangements, considered along the conveyance pass of the respective conveyer arrangement.

As the vacuum transport chamber is operated in an atmosphere having the lower pressure with respect to the ambient atmosphere pressure at that load-lock of the at least two load-locks in series which is nearer the vacuum transport chamber a pump operating on low pressure range e.g. a turbo pump may be provided only once at the common load-lock. Non-common load-locks of the addressed at least two load-locks in series may be operated with rough pumps.

In one embodiment of the apparatus according to the invention the input and the output load-lock arrangements comprise each the at least two load-locks in series along the conveyance pass of the respective conveyor arrangements. Thus, both load-lock arrangements are interconnected between the vacuum transport chamber and ambient atmosphere. At least one load-lock is common to the input and to the output load-lock arrangement and at least one of the at least two load-locks of the input load-lock arrangement is not common to the output load-lock arrangement and at least one of the at least two load locks of the output load lock arrangement is not common to the input load-lock arrangement. The at least one common load-lock is thereby located nearer to the vacuum transport chamber than the not common load-locks, considered along the conveyance pass respectively of the input and of the output conveyer arrangement.

As was addressed before, the common load-lock bridges a pressure difference on a smaller pressure level, than the non-common load-locks. This leads to the fact, that the more demanding pump, e.g. a turbo-pump may be provided once at the common load-lock, whereas the more than one non-common load-locks may be served by less demanding rough pumps.

In one embodiment of the embodiment just addressed of the apparatus according to the invention at least one of the load-locks in series is operatively connected to a substrate buffer stage. This allows e.g. to serve pasting substrates to and/or from the transport chamber of the vacuum treatment arrangement or -apparatus. It has to be noted that it is an advantage if pasting substrates are not vented to atmosphere, which leads to less contamination and faster handling times.

In one embodiment of the apparatus according to the invention at least one of the at least two load-locks in series is additionally at least one of:
  operationally connected to a substrate treatment station;
  operationally connected to a substrate buffer;
  a heating station;
  a cooling station;
  a degasser station.

In one embodiment of the apparatus according to the invention each of the at least two load-locks in series is operatively connected to a pump, at least one of the at least two load-locks in series which is located nearer to the vacuum transport chamber than other of the at least two load-locks in series, is operatively connected to a pump constructed to operate in a lower pressure range, than the pump operatively connected to the other load-lock of said at least two load-locks in series.

In one embodiment of the apparatus according to the invention at least one of the at least two load-locks in series is tailored for accommodating a single substrate or a single group of simultaneously conveyed substrates. Thereby the volume of the addressed load-lock becomes optimally small which shortens pumping down time spans or pressure equalization time spans.

Please note that whenever we speak in the present description and claims of handling "a substrate", it is to be understood that such "a substrate" may be a group of substrates which are commonly conveyed on a respective substrate holder of the respective conveyer arrangements.

In one embodiment of the apparatus according to the invention the input and the output load-lock arrangements as well as the input and the output conveyer arrangements are constructed to handle rectangular or square substrates.

In one embodiment of the embodiment just addressed of the apparatus according to the invention the shorter edge of the rectangular substrates or the edge of the square substrates is equal or larger than 400 mm or than 600 mm.

In one embodiment of the embodiment just addressed of the apparatus according to the invention the shorter edge is at most 1100 mm.

In one embodiment of the apparatus according to the invention the rectangular or square substrate has a maximum edge extent of 1400 mm.

In one embodiment of the apparatus according to the invention the input and the output conveyer arrangements are constructed to convey the substrates-square or rectangular-exclusively perpendicularly to edges of said substrates.

In one embodiment of the apparatus according to the invention at least one of the input and of the output conveyer arrangements is constructed to convey the substrates exclusively in translation mode. We thereby understand under conveying a substrate exclusively in transition mode, that the substrate is conveyed exclusively in such a manner, that all points of the substrate are always subjected to equal movement vectors. Thereby the angular orientation of the substrates is kept constant. This significantly facilitates predetermined and well controlled alignment of the conveyed substrates, especially of square- or rectangle-shaped substrates, more generically, of non-circular shaped substrates.

In one embodiment of the apparatus according to the invention one load-lock of the at least two load-locks in series which is nearer to the vacuum transport chamber than the other of the at least two load-locks in series, considered along the pass of the respective conveyer arrangement, is connected by a controlled gasflow-bypass to the other load-lock in series.

In one embodiment of the apparatus according to the invention the direction of conveyance of the respective conveyer arrangement towards one of said at least two load-locks in series and the direction of conveyance of said respective conveyer arrangement from said one load-lock are mutually perpendicular and the respective conveyer arrangement is constructed to convey plate shaped, flat or curved substrates, extending along a plane-locus which is parallel to both said directions.

In one embodiment of the apparatus according to the invention the substrates are plate-shaped, flat or curved, and extend along a plane-locus, whereby the input and the output conveyer arrangements are constructed to convey the plate-shaped substrates exclusively in directions parallel to the plane-locus.

In one embodiment of the apparatus according to the invention the input and the output load-lock arrangements are commonly constructed with a T- or Y-shaped foot-print, with at least one load-lock of the at least two load-locks in series of the input load-lock arrangement along one lateral arm of the T or Y, at least one load-lock of said at least two load-locks in series of the output load-lock arrangement along the other lateral arm of the T or Y and with at least one common, bidirectional load-lock in series along the central arm of the T or Y.

In one embodiment of the just addressed embodiment of the apparatus according to the invention the common load-lock is nearer to the vacuum transport chamber than the load-locks along said lateral arms, considered along the respective conveyer passes of the respective conveyer arrangements.

In one embodiment of the embodiment just addressed of the apparatus according to the invention the vacuum transport chamber comprises a recipient with an outer wall defining a cylindrical locus around a cylinder-axis, and a common load-lock along the central arm of the addressed T or Y is mounted to the recipient's outer wall with the conveyance passes of the conveyer arrangements through the addressed common load-lock in radial direction with respect to the cylinder-axis.

Thereby a well-controlled alignment of the substrates into and out of the vacuum transport chamber is significantly simplified, especially alignment of square- or rectangle-shaped substrates, more generically, of non-circular shaped substrates.

In one embodiment of the apparatus according to the invention the load lock of the at least two load locks which is nearer to the vacuum transport chamber than the other of the at least two load locks, considered along the pass of conveyance by the respective conveyer arrangement, is operationally connected to a high vacuum pump, preferably a turbo-molecular pump, having a base pressure of 0.001 Pa at most.

In one embodiment of the apparatus according to the invention the load lock of the at least two load-locks which is more distant from the vacuum transport chamber than the other of the at least two load locks, considered along the pass of conveyance by the respective conveyer arrangement, is operationally connected to a rough pump having a base pressure between 0.1 Pa and 1 Pa.

Unless in contradiction, one or more than one of the embodiments of the apparatus according to the invention as addressed may be combined with the generic apparatus structure according to the invention.

The invention is further directed to a method of vacuum treating at least one substrate or of manufacturing at least one vacuum treated substrate, by means of the apparatus according the invention or by means of the apparatus according to the invention in one or more than one of its embodiments as were addressed.

The invention is further directed on a method of vacuum treating at least one substrate or of manufacturing at least one vacuum treated substrate comprising:
  conveying a substrate from ambient atmosphere through a first load-lock;
  subsequently, conveying the substrate from the first load-lock through at least one second load-lock;
  conveying the substrate from the at least one second load-lock into a vacuum transport chamber serving more than one treatment stations;
  conveying the substrate in said vacuum transport chamber towards at least one of the more than one of the vacuum treatment stations;
  treating the substrate by the at least one vacuum treatment station;
  conveying the treated substrate from the vacuum transport chamber through an output load-lock arrangement.

In one variant of the method just addressed, the conveying of the treated substrate from the vacuum transport chamber through the output load-lock arrangement comprises:
  conveying the treated substrate from the vacuum transport chamber through at least one third load-lock;
  conveying the substrate from the at least one third load-lock through a fourth load-lock to ambient atmosphere.

In one variant of the just addressed variant of the method the second load-lock is selected to be common with the third load lock.

The invention is further directed on a method of vacuum treating at least one substrate or of manufacturing at least one vacuum treated substrate comprising:
  conveying a substrate through an input load-lock arrangement into a vacuum transport chamber serving more than one vacuum treatment stations;
  conveying the substrate in the vacuum transport chamber towards one of the more than one of the vacuum treatment stations;
  treating the substrate by the at least one vacuum treatment station;
  conveying the treated substrate from the vacuum transport chamber through at least one second load-lock;
  conveying the substrate from the at least one second load-lock through a first load-lock to ambient atmosphere.

Embodiments of the invention shall now be further exemplified with the help of figures.

The figures show:

FIG. 1: shows schematically and simplified, by means of a functional block/signal flow diagram and by means of an embodiment of the apparatus according to the invention, the principle of the present invention.

Figure 2:
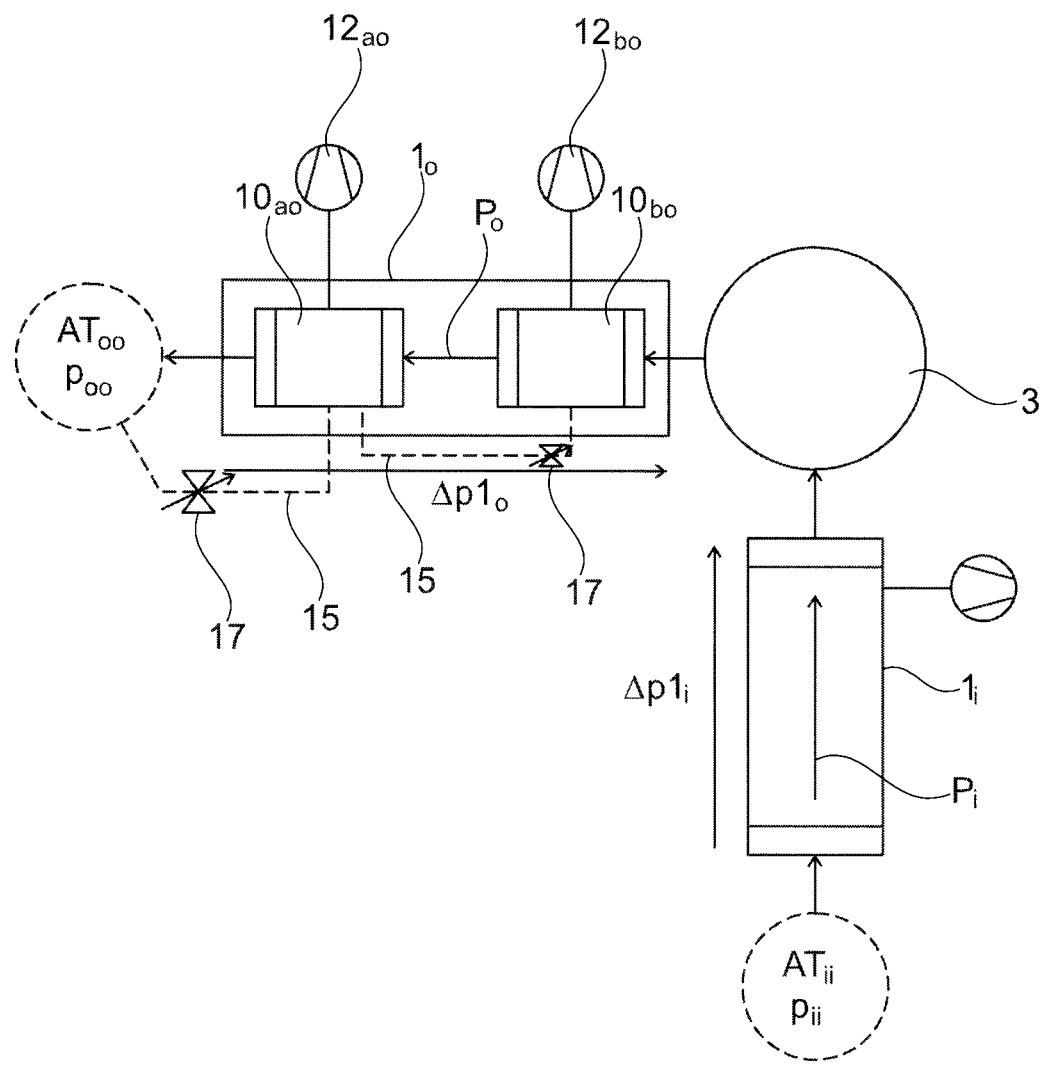
Figure 3:
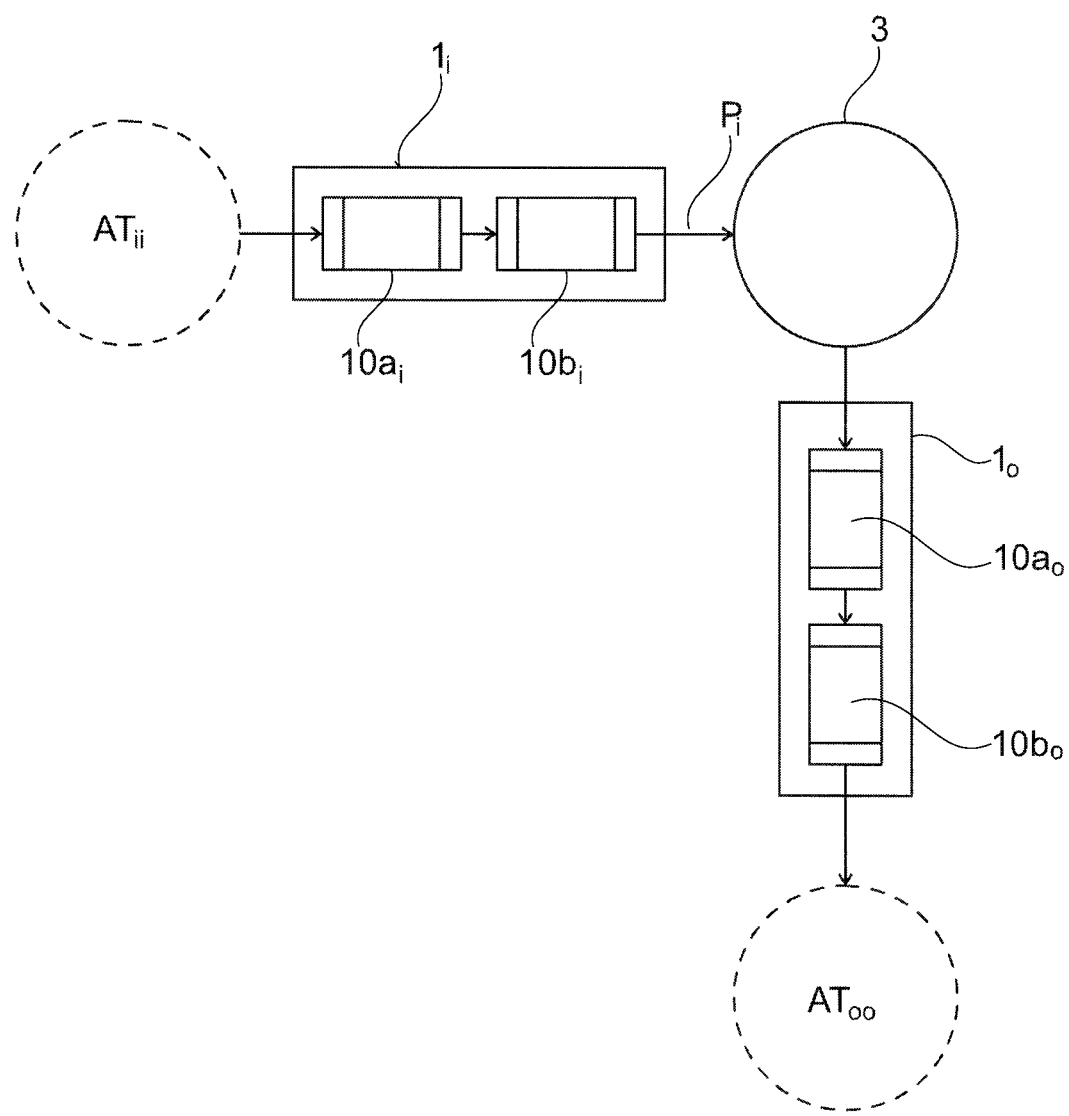
Figure 4:
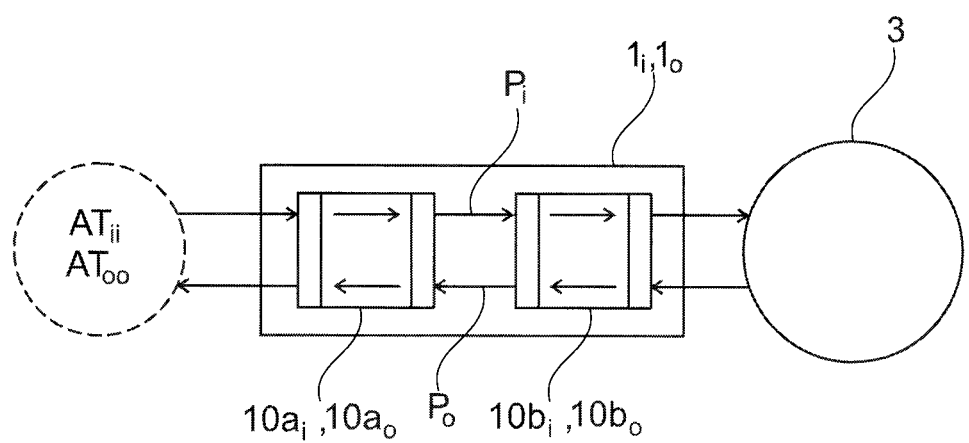
Figure 5:
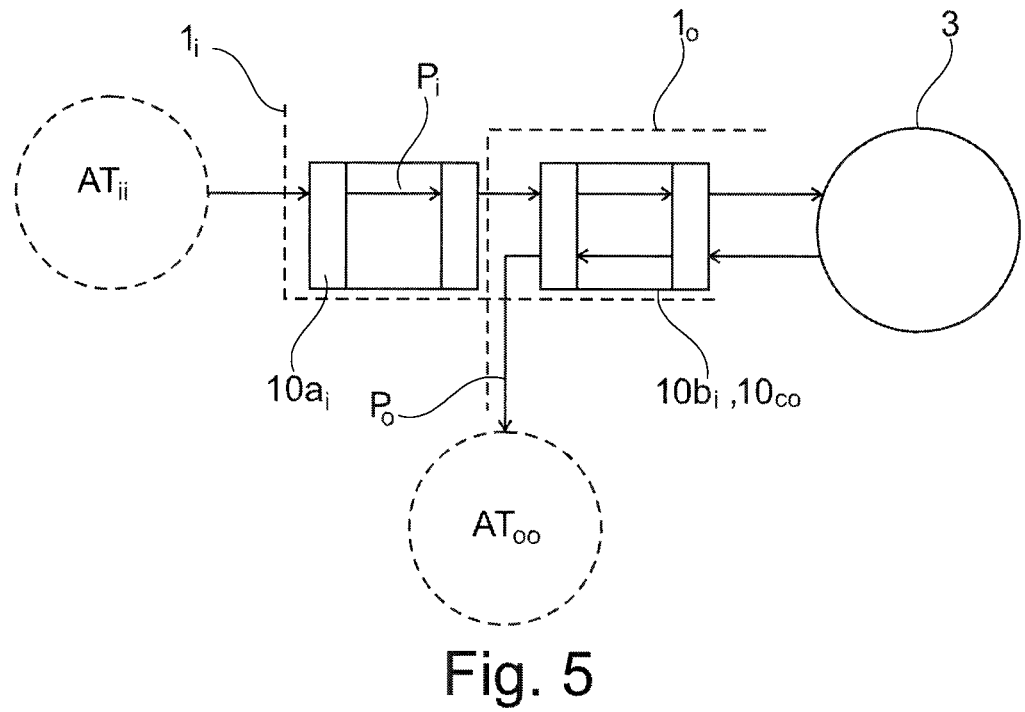
Figure 6:
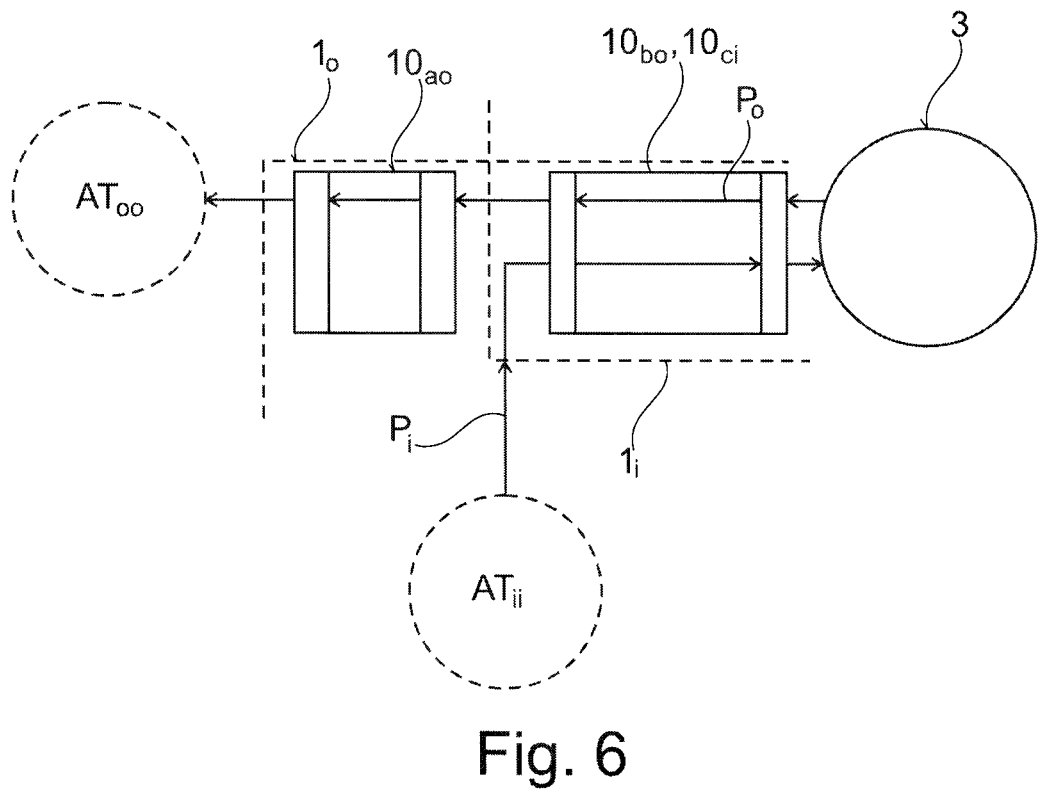
Figure 7:
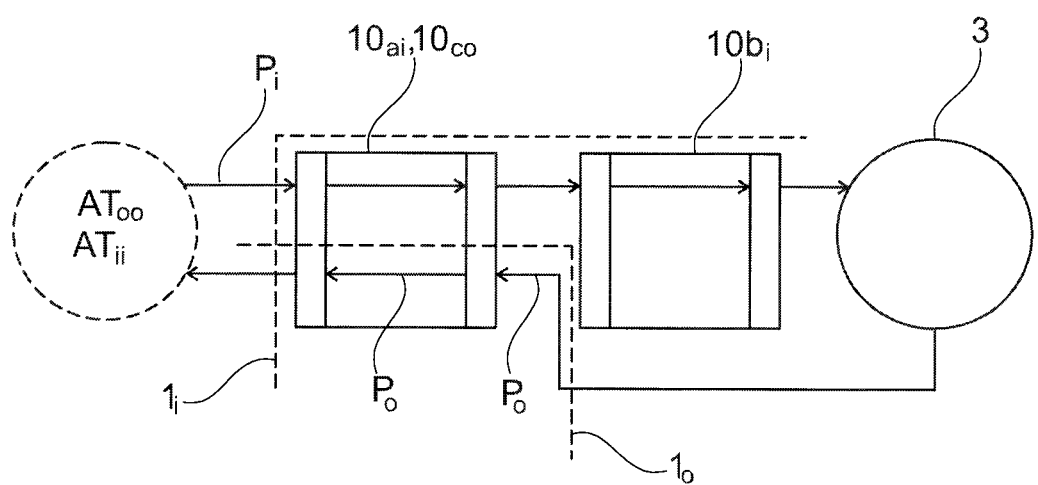
Figure 8:
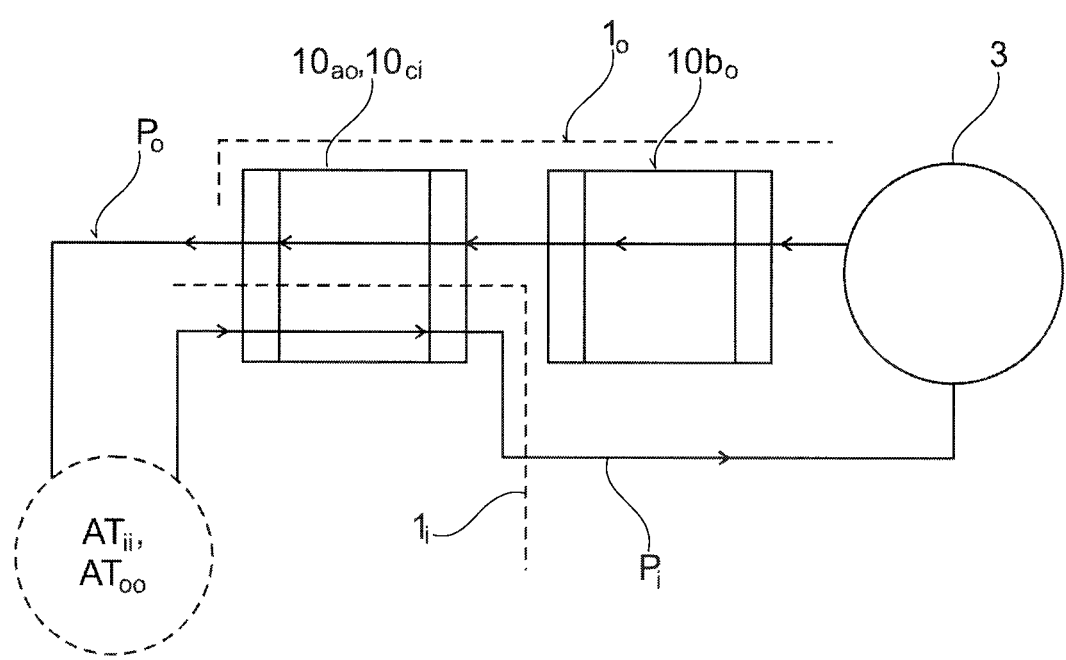
Figure 9:
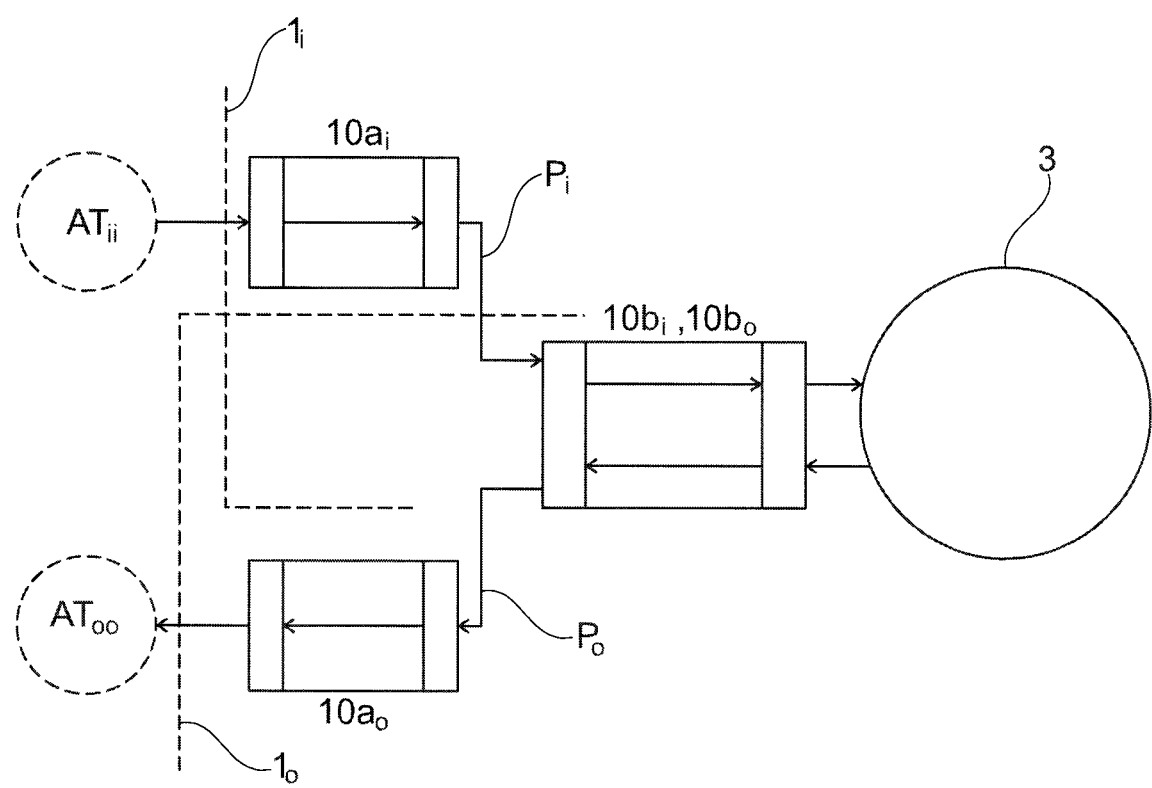
Figure 10:
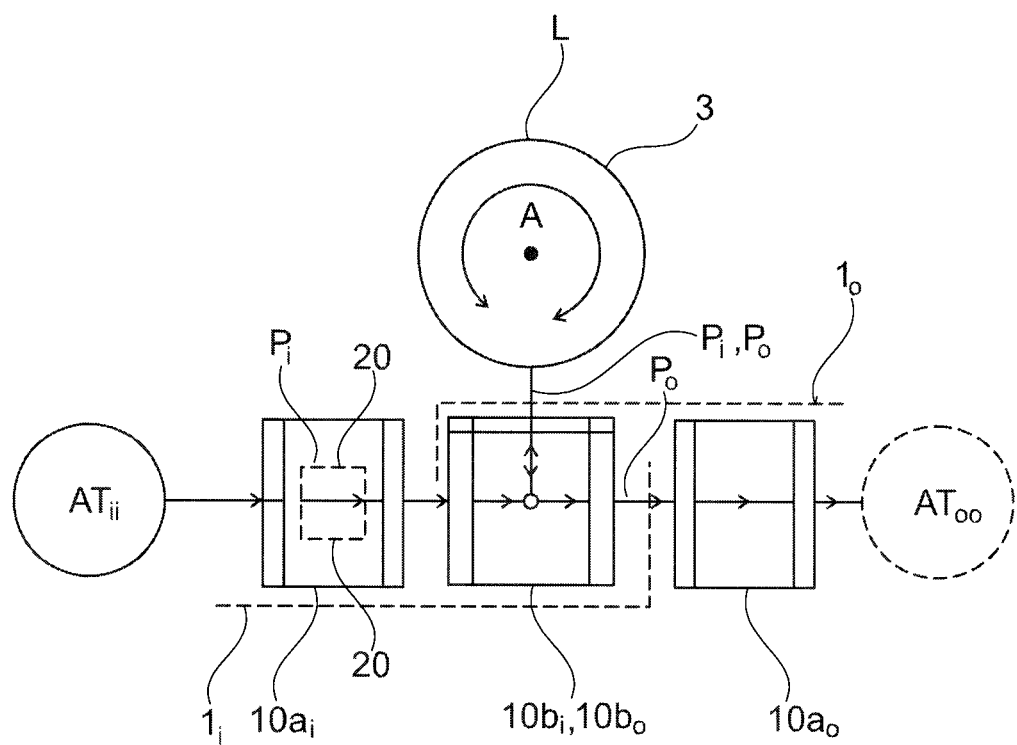
Figure 11:
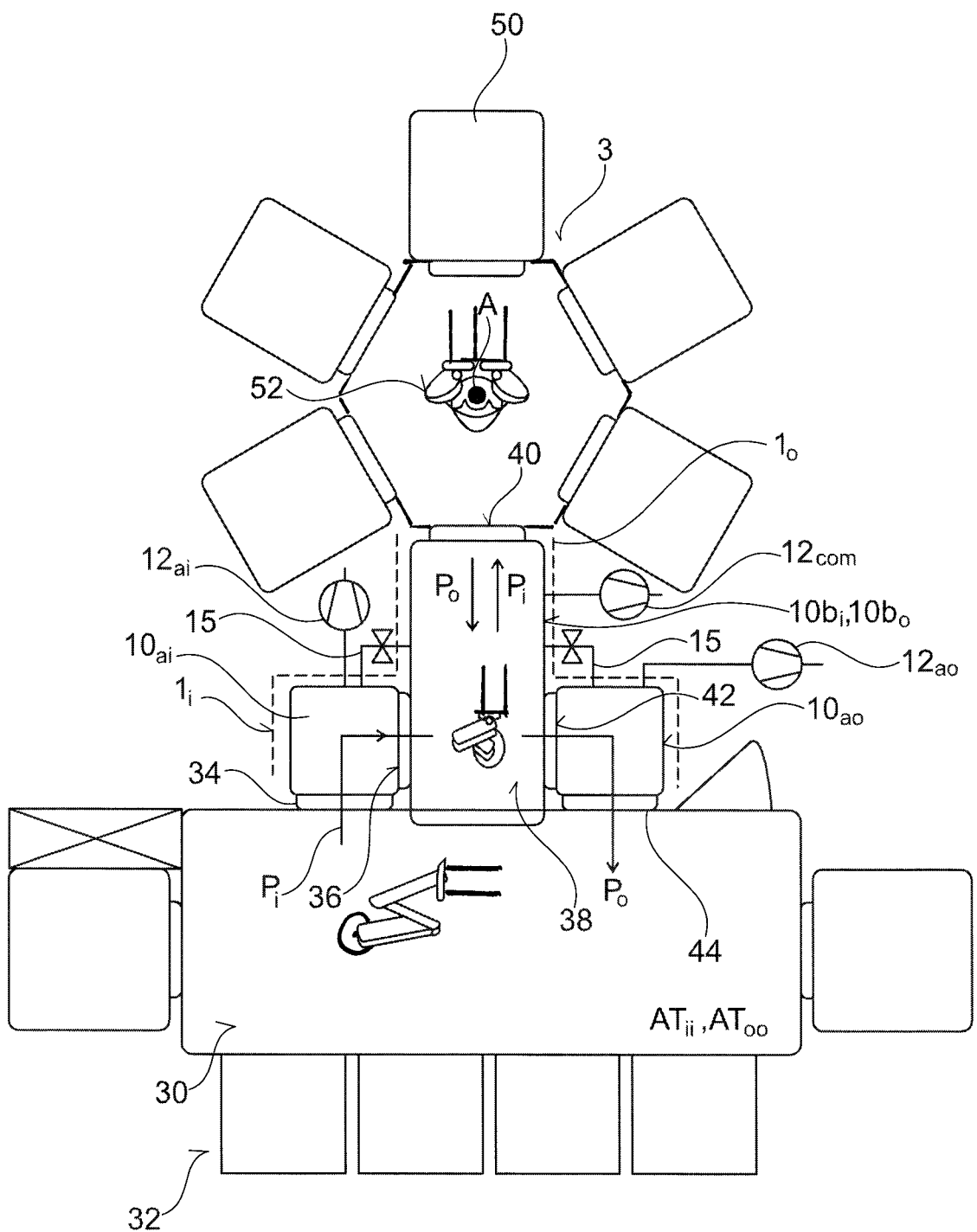

FIG. 2: shows in a representation in analogy to that of FIG. 1, a further embodiment of the apparatus according to the invention;

FIG. 3: shows in a representation in analogy to those of FIGS. 1 and 2, a further embodiment of the apparatus according to the invention;

FIG. 4: shows in a representation in analogy to those of FIGS. 1 to 3 a further embodiment of the apparatus according to the invention;

FIG. 5: shows in a representation in analogy to those of FIGS. 1 to 4 a further embodiment of the apparatus according to the invention;

FIG. 6: shows in a representation in analogy to those of FIGS. 1 to 5 a further embodiment of the apparatus according to the invention;

FIG. 7: shows in a representation in analogy to those of FIGS. 1 to 6 a further embodiment of the apparatus according to the invention;

FIG. 8: shows in a representation in analogy to those of FIGS. 1 to 7 a further embodiment of the apparatus according to the invention;

FIG. 9: shows in a representation in analogy to those of FIGS. 1 to 8 an embodiment towards an embodiment as realized today;

FIG. 10: shows in a representation in analogy to those of the FIGS. 1 to 9 and departing from an embodiment according to FIG. 9, a further embodiment of the apparatus according to the invention;

FIG. 11: shows schematically and simplified an embodiment of the apparatus according to the invention as practiced today, in a top-view.

Figure 12:
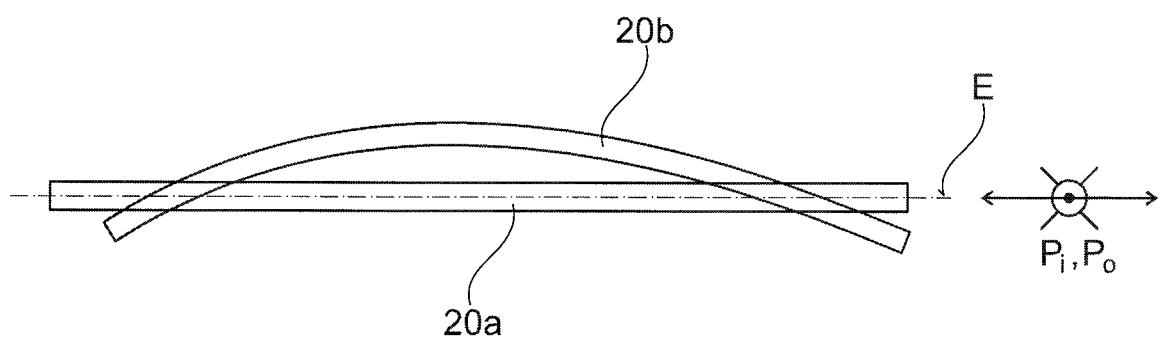

FIG. 12: Schematically substrates extending along a plane-locus and as treated by embodiments of the apparatus according to the invention with directions of conveyance as provided in some embodiments of the apparatus.

FIG. 1 shows schematically and simplified and by means of an embodiment of the invention, the principle of the present invention with respect to loading substrates through an input load-lock arrangement $1_i$ towards and into a vacuum transport chamber 3 of a vacuum treatment arrangement or -apparatus. Substrates (not shown) are unloaded from the vacuum transport chamber 3 via output load-lock arrangement $1_o$. The input load-lock arrangement $1_i$ is provided from ambient input atmosphere $AT_{ii}$ of an input ambient pressure $p_{ii}$ towards the vacuum transport chamber 3. The input load lock arrangement $1_i$ bridges a pressure difference $\Delta p1_i$ from the higher ambient input pressure $p_{ii}$ to a lower output vacuum -atmosphere pressure $p_{oi}$ of the vacuum transport chamber 3.

The output load-lock arrangement $1_o$ bridges a pressure difference $\Delta p1_0$ to an atmosphere $AT_{oo}$ of output atmosphere pressure $p_{oo}$, from a vacuum pressure $p_{oi}'$ at the vacuum transport chamber 3. The input atmosphere $AT_{ii}$ is, as was addressed, ambient atmosphere. Most often, but not necessarily, the vacuum pressures $p_{oi}$ and $p_{oi}'$ are at least similar.

There is provided an input conveyer arrangement (not shown) which conveys single substrates or single groups of simultaneously conveyed substrates on respective single-od multi-substrate carriers (not shown) along an input conveyance pass $P_i$ towards the vacuum transport chamber 3 of a vacuum substrate treatment arrangement.

There is provided an output conveyer arrangement (not shown) which conveys single substrates or single groups of simultaneously conveyed substrates on respective single-od multi-substrate carriers (not shown) along an output conveyance pass $P_o$ from the vacuum transport chamber 3.

As described up to now the apparatus accords with known apparatus. In such known apparatus the input load-lock arrangement as well as the output load-lock arrangement consist of a single load-lock.

According to the present invention, at least one of the input load-lock arrangement $1i$ and of the output load-lock arrangement $1_o$ comprises at least two load-locks, provided in series along the respective conveyance pass $P_i$ and /or $P_o$. That or those load-lock arrangement(s) comprising the at least two load-locks in series, is (are) interconnected between the vacuum transport chamber 3 and ambient atmosphere, in FIG. 1 the input load-lock arrangement.

According to the embodiment of FIG. 1 the input load-lock arrangement only is provided with the at least two load-locks $10ai$ and $10bi$. In most applications, providing only two load-locks $10ai$, $10bi$ suffice to bridge the pressure difference $\Delta p1_i$ at the input load-lock arrangement $1i$ and/or, in analogy, to bridge a pressure difference $\Delta p1_o$ at the output load-lock arrangement $1_o$ if also provided with at least two load-locks in series.

By providing two or more load-locks $10ai,10bi, \ldots$ the respective overall pressure difference $\Delta p1_i$ and/or $\Delta p1_o$—if provided with at least two load-locks in series-is subdivided in load-lock specifically bridged pressure differences $\Delta p10_{ai}$, $\Delta p10_{bi}$, etc.

Please note, that although according to the representation of FIG. 1 and of following figures, two load-locks directly connected in series are shown each with a facing load-lock valve, such facing load-lock valves are normally realized by one common valve, common to both load-locks in series.

The substrate-throughput of the overall apparatus needs not be lower than the substrate-throughput of an apparatus with single load-lock input and/or output load-lock arrangement. This because the substrate-throughput is customarily governed by a machine clock which is adapted to that overall processing step with the longest processing time. Because the load locks $10ai,10bi \ldots$ , each in fact performing a processing step, bridge smaller pressure differences, compared with the overall pressure difference $\Delta p1_i$ and /or $\Delta p1_o$ pumping of the respective load-locks $10ai,10bi$ by pumps $12ai$, $12bi \ldots$ necessitates shorter time spans than pumping a load-lock bridging $\Delta p1_i$ and /or $\Delta p1_o$.Therefore the multi-load concept according to the invention does not reduce the substrate-throughput, compared with substrate-throughput of single load-lock arrangement apparatus. Moreover, the pumps of load-locks in series located nearer to the vacuum transport chamber 3 along the respective conveyance pass $P_i$ and /or $P_o$ as of pump $12bi$ in FIG. 1, operate on lower pressure levels than pumps of load-locks in series, as of $12ai$ in FIG. 1, which are more remote from the vacuum transport chamber 3.

This allows to apply to each of the load-locks in series $10ai$, $10bi$, . . . a pump which optimally operates in the respective pressure range.

Further and considered along the respective conveyance pass $P_i$ and /or $P_o$ each of the at least two load-locks in series $10ai$, $10bi$, . . . needs only be pressure-equalized to the lower pressure of the pressure difference bridged by the neighboring load-lock in series more remote from the vacuum transport chamber 3. In FIG. 1 the load-lock $10bi$ is to be pressure-equalized to the lower pressure on which load-lock $10ai$ operates. This might be done via the respective ones of the load-lock substrate handling valves 14 as the pressure differences to be equalized are small, but is, in one embodiment according to FIG. 1, performed via gasflow-bypasses 15 with respective control valves 17. Pressure equalization of the load-lock necessitates shorter time spans, compared with pressure equalization of a single-load-lock load-lock arrangement $1i$ and /or $1_o$.

Still further a substrate or a group of substrates commonly conveyed on a respective substrate carrier along the conveyance pass $P_i$ and/or $P_o$ stays longer under reduced pressure, because the time span for conveyance through the input load-lock arrangement $1_i$ and/or through the output load-lock arrangement $1_o$ —if provided with at least two load-locks in series as well-necessitates more than one machine clock, e.g. one per load-lock in series. This may be highly advantageous for conditioning the untreated substrates prior to entering the vacuum transport chamber 3 of a vacuum treatment arrangement or for reconditioning treated substrates leaving the vacuum transport chamber 3.

As further shown in FIG. 1, one of the at least two load-locks $10ai$, $10bi$, in one embodiment, the load-lock $10bi$ nearer to the vacuum transport chamber 3, may be operationally connected to a substrate buffer 19. Such substrate buffer may contain pasting substrates fed to the vacuum transport chamber 3 at predetermined moments and removed e.g. via the respective output load lock arrangement $1_o$.

Additionally, to their load-lock function the load-locks $10ai$, $10bi$, . . . may be tailored for substrate cooling, heating, degassing function and may be operatively connected to additional substrate treatment stations (not shown).

The conveyor arrangements for the conveyance passes $P_i$ and/or Pa are realized by a respective number of substrate handling robots.

As an example:

As $AT_{11}$ is ambient atmosphere and e.g. only two load-locks $10ai$ and $10bi$ are provided, load-lock $10ai$ may be operated with a pump $12ai$ which is a rough pump, e.g. with a base pressure of 0.1 to 1 Pa. The load-lock $10bi$ just upstream a high vacuum transport chamber 3 is operated by a turbo pump 12$bi$ with a base pressure below 0.001 Pa. Thereby $\Delta p10_{ai}$ may be in the range of $1e^5$ Pa, $\Delta p10bi$ in the range of 1 Pa.

The concept explained with the help of FIG. 1 and the respective characteristics are valid also for the further embodiments of the apparatus as will be presented in the following.

FIG. 2 shows in a representation in analogy to that of FIG. 1 an embodiment of the apparatus according to the invention whereat only the output load-lock arrangement 10 is provided with the at least two load-locks in series 10$ao$ and 10$bo$ with the respective pumps 12$ao$ and 12$bo$. The other reference numbers of FIG. 2 address the same entities as they do in FIG. 1. Thus, the embodiment is completely clear to the skilled artisan having understood the embodiment of FIG. 1.

As in the embodiment of FIG. 2 $AT_{oo}$ is ambient atmosphere, and e.g. only two load locks 10$ao$ and 10$bo$ are provided along the output load lock arrangement $1_o$, and further the vacuum transport chamber 3 is a high vacuum transport chamber, the example given in context with FIG. 1 may also be valid for the embodiment of FIG. 2.

FIG. 3 shows in a representation in analogy to those of FIGS. 1 and 2 an embodiment of the apparatus according to the invention, whereat the input load-lock arrangement $1_i$ as well as the output load-lock arrangement $1_o$ are realized according to the invention i.e. with at least two load-locks in series 10$ai$,10$bi$ and 10$ao$, 10$bo$ each. The embodiment of FIG. 3 is thus a combination of the embodiment of FIG. 1 with the embodiment of FIG. 2. The atmosphere $AT_{ii}$ and $AT_{oo}$ are both ambient atmosphere. Both load-lock arrangements are realized just with two load-locks in series respectively and the vacuum transport chamber 3 is again a high vacuum transport chamber. Thus, the example given in context with the FIGS. 1 and 2 may be realized also in the embodiment of FIG. 3.

In the embodiments which will be presented in the following, at least one of the at least two load-locks in series of one of the load-lock arrangements is common with a load-lock of the other load-lock arrangement. This has the advantage that a single load-lock with the respective pump is exploited for the input load-lock arrangement as well as for the output load-lock arrangement. Especially if such common load-lock is nearer to the vacuum transport chamber 3 than the other load-lock in series, considered along the conveyance pass of the addressed one load-lock arrangement, and thus necessitates a more demanding pump, operating in lower pressure range, one such pump may be saved.

The common load-lock in series is thereby a bidirectionally operated load-lock.

FIG. 4 shows in a representation in analogy to those of FIGS. 1 to 3 an embodiment whereat all the at least two load-locks in series 10$ai$ and 10$bi$ of the input load-lock arrangement $1_i$ are common with all the at least two load-locks in series 10$ao$, 10$bo$ of the output load-lock arrangement $1_o$.

FIG. 5 shows in a representation in analogy to those of FIGS. 1 to 4 an embodiment of the apparatus according to the invention whereat the load-lock in series 10$bi$ nearer to the vacuum transport chamber 3 of the at least two load locks in series 10$ai$ and 10$bi$ of the input load-lock arrangement $1_i$ is common with a load-lock 10$co$ of the output load-lock arrangement $1_o$. Please note that the output load-lock arrangement $1_o$ may comprise only one load lock, as of load-lock 10$co$. Such configuration may be used e.g. if the atmosphere $AT_{oo}$ is the atmosphere of a low-pressure station, e.g. of a vacuum conditioning station for treated substrates.

FIG. 6 shows in a representation in analogy to those of FIGS. 1 to 5 an embodiment whereat the load-lock in series 10$bo$ nearer to the vacuum transport chamber 3 of the at least two load-locks in series 10$ao$ and 10$bo$ of the output load-lock arrangement $1_o$ is common with a load-lock 10$ci$ of the input load-lock arrangement $1_i$. Please note that the input load-lock arrangement $1_i$ may comprise only load lock 10$ci$. Such configuration may be used e.g. if the atmosphere $AT_{ii}$ is the atmosphere of a low-pressure station, e.g. of a vacuum degasser station for untreated substrates.

FIG. 7 shows in a representation in analogy to those of FIGS. 1 to 6 an embodiment whereat the load-lock 10$ai$ more remote from the vacuum transport chamber 3 of the at least two load-locks in series 10$ai$ and 10$bi$ of the input load-lock arrangement $1_i$ is common with a load-lock 10$co$ of the output load-lock arrangement $1_o$. Please note that the output load-lock arrangement $1_o$ may comprise only load-lock 10$co$. Such configuration may e.g. be used, if the last treatment step within the apparatus with the vacuum transport chamber 3 is performed on a higher pressure than an initial process step performed on the just input, yet untreated substrate. Such a higher-pressure process step might e.g. be a cooling step for the substrate before leaving the vacuum transport chamber 3.

FIG. 8 shows in a representation in analogy to those of FIGS. 1 to 7 an embodiment whereat the load-lock in series 10$ao$ more remote from the vacuum transport chamber 3 of the at least two load-locks in series 10$ai$ and 10$bo$ of the output load-lock arrangement $1_o$ is common with a load-lock 10$ci$ of the input load-lock arrangement $1_i$. Please note that the input load-lock arrangement $1_i$ may comprise only load lock 10$ci$. Such configuration may be used e.g. if the input processing station of the apparatus with the vacuum transport chamber 3 operates on a higher pressure on a yet untreated substrate than a last treatment station of the apparatus with the vacuum transport chamber 3 after which the substrate leaves the chamber 3. The input processing station may e.g. be a degasser station.

FIG. 9 shows in a representation in analogy to those of FIGS. 1 to 8 an embodiment towards an embodiment as realized today. The input load-lock arrangement $1_i$ as well as the output load-lock arrangement $1_o$ comprise each the at least two load-locks in series 10$ai$, 10$bi$ and 10$ao$,10$bo$ respectively. The load-lock 10$bi$ which is located nearer to the vacuum transport chamber 3, considered along the input conveyance pass $P_i$, than load lock 10$ai$ of the input load-lock arrangement $1_i$ is common with the load-lock 10$bo$ of the output load-lock arrangement $1_o$, which load lock 10$bo$ is nearer to the vacuum transport chamber 3 than the load lock 10$ao$ of the output load lock arrangement $1_o$, considered along the output conveyance pass $P_o$.

Only one demanding pump operating on a lower pressure range, as e.g. a turbo-molecular pump is to be provided, pumping the common, bidirectional load-lock 10$bi$,10$bo$, whereas the non-common load-locks 10$ai$ and 10$ao$ may be pumped by less demanding pumps operating at higher pressures, as respective rough pumps.

Especially if substrates to be treated by the apparatus according to the invention are rectangular or square, more generically not circular, accurately maintaining directional orientation of the substrates is significantly simplified if the substrates are conveyed from one load lock in series to the next and finally into and from the vacuum transport chamber 3 without rotation i.e. in a translation mode.

Departing from the embodiment according to FIG. 9 this is realized by the embodiment according to FIG. 10, in a representation in analogy to the representations of FIGS. 1 to 9. The conveyance pass $P_i$ towards and through the non-common load-lock in series 10*ai* and into the common load-lock in series 10*bi*, 10*bo* as well as the conveyance pass $P_o$ from the common load-lock in series 10*bi*,10*bo*, towards and through the non-common load-lock in series 10*ao* are linear and parallel or even aligned and are perpendicular to the common, bidirectional conveyance pass $P_i$,$P_o$ from the common load-lock in series 10*bi*,10*bo* towards and from the vacuum transport chamber 3. A substrate 20, shown in dash line in FIG. 10, is plate shaped, may be flat as substrate 20*a* in FIG. 12 or may be curved as exemplified by substrate 20*b* in FIG. 12, extends along a plane-locus E as shown in FIG. 12. The substrate 20 is oriented with its extended surfaces parallel to the passes $P_i$, $P_o$ and to the common pass $P_i$, $P_o$ and needs neither be rotated between the input to the input load-lock arrangement $1_i$ and the input to the vacuum transport chamber 3 nor between the input and output of the output load-lock arrangement $1_o$. If the vacuum transport chamber 3 has an outer wall—e.g. in polygon shape—defining a cylindrical locus L around a central axis A, perpendicular to the conveyance plane of the substrate, which accords with or is parallel to plane-locus E of FIG. 12, the load-lock in series 10*bi*,10*bo* is mounted to the addressed wall so that the direction of the linear common pass $P_i$, $P_o$ is radial with respect to the axis A. Often multi station vacuum transport chambers 3 are constructed with a recipient having a wall defining a cylindrical locus around the axis A and the substrates are conveyed in the recipient, as addressed by the arrow in FIG. 10, around the axis A from one treatment station to the next.

FIG. 11 shows schematically and simplified an embodiment of the apparatus according to the invention as practiced today, in a top-view.

A robot arrangement 30 with one or more robots operating in ambient atmosphere $AT_{ii}$, $AT_{oo}$ handles single plate shaped substrates 20 (not shown in FIG. 11) e.g., rectangular or square, typically in the range from 400×400 mm up to 650×650 mm, or even larger, from a magazine arrangement 32 through an input slit-valve 34 into the load-lock 10*ai* of the input load-lock arrangement 1*i*. The load-lock 10*ai* is pumped by a rough pump 12*ai*.

A bidirectional robot 38 in the common load-lock 10*bi*, 10*bo* conveys the substrate from load-lock 10*ai* through slit valve 36, common to load locks 10*ai* and common load-lock 10*bi*, 10*bo*. The robot 38 loads the untreated substrate through slit valve 40 to the vacuum transport chamber 3 and removes a treated substrate from the vacuum transport chamber arrangement 3 through slit valve 40 as well.

The treated substrate in common load-lock 10*bi*,10*bo* is conveyed by robot 38, through slit valve 42 into load-lock 10*ao*, and from load-lock 10*ao* by means of the robot arrangement 30 and via slit valve 44 back to the magazine arrangement 32 at ambient atmosphere $AT_{oo}$. A valve-controlled pressure equalization bypass 15 is provided from load-lock 10*ai* to common load-lock 10*bi*,10*bo* and from the latter to load-lock 10*ao*.

The load-lock 10*ao* is pumped by means of a rough pump 12*ao*, whereas the common load lock 10*bi*,10*bo* is pumped by a turbo pump 12*com*.

Whereas in the load-locks 10*ai* and 10*ao* the substrates are brought from ambient pressure to a pre-vacuum and respectively inversely, the substrates are brought in the common load-lock 10*bi*,10*bo* from the pre-vacuum towards high vacuum, as operated in the vacuum transport chamber 3, or inversely.

The vacuum transport chamber 3 serves five treatment stations 50 grouped around an axis A. The high vacuum robot 52 serves substrates from and towards the slit valve 40 and from one treatment station 50 to the other. The conveyance passes $P_i$ and $P_o$ as well as the common, bidirectional conveyance pass $P_i$, $P_o$ are established as was explained in context with FIG. 10.

What is claimed is:

1. A substrate vacuum treatment apparatus comprising:
   a vacuum treatment arrangement for at least one substrate, comprising a vacuum transport chamber serving multiple treatment chambers;
   an input load-lock arrangement positioned along an input conveyance pass, said input conveyance pass being a path along which at least one substrate is conveyed to said vacuum transport chamber;
   an output load-lock arrangement positioned along an output conveyance pass, said output conveyance pass being a path along which at least one substrate is conveyed from said vacuum transport chamber;
   wherein at least one of said input and of said output load-lock arrangements comprises at least two load-locks in series, considered along the respective conveyance pass of the respective load-lock arrangement and said at least one of said input load-lock arrangement and of said output load-lock arrangement is interconnected between ambient atmosphere and said vacuum transport chamber,
   wherein each one of said at least two load-locks in series is operatively connected to a respective pump by a respective line directly connected to said respective load-lock.

2. The apparatus of claim 1, wherein said input and said output load-lock arrangements comprise each at least two load-locks in series along the respective conveyance pass of the respective load-lock arrangement.

3. The apparatus of claim 1, wherein at least said input load-lock arrangement comprises said at least two load-locks in series and at least one of said at least two load locks of said input load lock arrangement is not a load-lock of said output load lock arrangement.

4. The apparatus of claim 1, wherein at least said output load-lock arrangement comprises said at least two load-locks in series and at least one of said at least two load-locks of said output load lock arrangement is not a load lock of said input load lock arrangement.

5. The apparatus of claim 1, wherein at least one of said at least two load locks is common to said input and to said output load lock arrangement.

6. The apparatus of claim 5, wherein said common load lock of said at least two load locks is nearer to said vacuum transport chamber than the other of said at least two load locks, considered along the respective conveyance pass of the respective load-lock arrangement.

7. The apparatus of claim 1, wherein said input and said output load lock arrangements comprise each at least two load locks in series along the respective conveyance pass of the respective load-lock arrangement and at least one load lock is common to said input and to said output load lock arrangement, at least one of said at least two load locks of said input load lock arrangement being not common to said output load lock arrangement, at least one of said at least two load locks of said output load lock arrangement being not common to said input load lock arrangement, said at least one common load lock being located nearer to said vacuum transport chamber than said not common load locks, considered along the respective conveyance pass of the respective load-lock arrangement.

8. The apparatus of claim 1, wherein at least one of said load locks in series is operatively connected to a substrate buffer.

9. The apparatus of claim 1, wherein at least one of said load-locks in series is additionally configured for one of cooling, heating or degassing or may be operatively connected to an additional substrate treatment station.

10. The apparatus of claim 1, wherein the respective pump connected to whichever of the at least two load locks in series is located nearer to said vacuum transport chamber than the other of said at least two load locks in series is constructed to operate in a lower pressure range than the respective pump operatively connected to said other of said at least two load locks in series.

11. The apparatus of claim 1, wherein at least one of said at least two load locks in series is tailored for accommodating a single substrate or a single group of simultaneously conveyed substrates.

12. The apparatus of claim 1, wherein said input and said output load lock arrangements are constructed to handle rectangular or square substrates.

13. The apparatus of claim 12, wherein a shorter edge of the rectangular substrates or an edge of the square substrates is equal to or larger than 400 mm.

14. The apparatus of claim 13, wherein said shorter edge is at most 1100 mm.

15. The apparatus of claim 12, wherein said rectangular or square substrate has a maximum edge extent of 1400 mm.

16. The apparatus of claim 12, wherein said substrates are conveyed exclusively perpendicularly to edges of said substrates.

17. The apparatus of claim 1, wherein at least one of said input load-lock arrangement and said output load-lock arrangement is constructed to convey said substrates exclusively in translation mode.

18. The apparatus of claim 1, wherein one load lock of said at least two load locks in series which is nearer to said vacuum transport chamber than the other of said at least two load locks in series, considered along the respective conveyance pass of the respective load-lock arrangement, is connected by a controlled gasflow-bypass to said other load-lock in series.

19. The apparatus of claim 1, wherein the direction of conveyance of the respective load-lock arrangement towards one of said at least two load locks in series and the direction of conveyance of said respective load-lock arrangement from said one load-lock in series are mutually perpendicular and the respective load-lock arrangement is constructed to convey plate shaped, flat or curved substrate, extending along a plane-locus which is parallel to both said directions.

20. The apparatus of claim 1, wherein said substrates are plate shaped, flat or curved, and extend along a plane-locus, said input and said output load-lock arrangements are constructed to convey said plate shaped substrates exclusively in directions parallel to said plane-locus.

21. The apparatus of claim 1, wherein said input and said output load-lock arrangements are commonly constructed with a T- or Y-shaped foot-print, with at least one load-lock of said at least two load-locks in series of said input load-lock arrangement along one lateral arm of said T or Y, at least one load-lock of said at least two load-locks in series of said output load-lock arrangement along the other lateral arm of said T or Y and with at least one common, bidirectional load-lock in series along a central arm of said T or Y.

22. The apparatus of claim 21, wherein said common load-lock is nearer to said vacuum transport chamber than said load-locks along said lateral arms, considered along the respective conveyance passes of said load-lock arrangements.

23. The apparatus of claim 21, wherein said vacuum transport chamber comprises a cylindrical outer wall and is configured to convey substrates around a central axis of said cylindrical outer wall and said common load lock along said central arm is mounted to said cylindrical outer wall with the conveyance passes of said load-lock arrangements through said common load lock extending in a radial direction with respect to said central axis.

24. The apparatus of claim 1, wherein the respective pump connected to whichever of said at least two load-locks in series is nearer to said vacuum transport chamber than the other of said at least two load-locks in series, considered along the respective conveyance pass of the respective load-lock arrangement, is a high vacuum pump having a base pressure of 0.001 Pa or less.

25. The apparatus of claim 1, wherein the load-lock of said at least two load-locks which is more distant from said vacuum transport chamber than the other of said at least two load-locks, considered along the respective conveyance pass of the respective load-lock arrangement, is operationally connected to a rough pump having a base pressure between 0.1 Pa and 1 Pa.

26. A method of vacuum treating at least one substrate or of manufacturing at least one vacuum treated substrate, by means of an apparatus according to claim 1.

27. A method of vacuum treating at least one substrate or of manufacturing at least one vacuum treated substrate comprising:
  conveying a substrate from ambient atmosphere through a first load-lock;
  subsequently conveying said substrate from said first load-lock through at least one second load-lock;
  conveying said substrate from said at least one second load-lock into a vacuum transport chamber serving more than one treatment stations;
  conveying said substrate in said vacuum transport chamber towards at least one of said more than one of said vacuum treatment stations;
  treating said substrate by said at least one vacuum treatment station;
  conveying said treated substrate from said vacuum transport chamber through an output load-lock arrangement, wherein each one of said first load-lock and said second load-lock are operatively connected to a respective pump by a respective line directly connected to said respective load-lock.

28. The method of claim 27, wherein said step of conveying said treated substrate from said vacuum transport chamber through said output load-lock arrangement comprises:
  conveying said treated substrate from said vacuum transport chamber through at least one third load-lock;
  conveying said substrate from said at least one third load-lock through a fourth load-lock to ambient atmosphere.

29. The method of claim 28, further comprising selecting said second load-lock to be common with said third load lock.

30. A method of vacuum treating at least one substrate or of manufacturing at least one vacuum treated substrate comprising:
- conveying a substrate through an input load-lock arrangement into a vacuum transport chamber serving more than one vacuum treatment stations;
- conveying said substrate in said vacuum transport chamber towards one of said more than one of said vacuum treatment stations;
- treating said substrate by said at least one vacuum treatment station;
- conveying said treated substrate from said vacuum transport chamber through at least one second load-lock;
- conveying said substrate from said at least one second load-lock through a first load-lock to ambient atmosphere,
- wherein each one of said first load-lock and said second load-lock are operatively connected to a respective pump by a respective line directly connected to said respective load-lock.

* * * * *